United States Patent
Kojima

[11] Patent Number: 6,111,417
[45] Date of Patent: *Aug. 29, 2000

[54] SEMICONDUCTOR COMPONENT TEST APPARATUS INCLUDING SUCKING MECHANISM MAINTAINING COMPONENTS IN TRAY DURING TESTING

[75] Inventor: Shinichi Kojima, Ono, Japan

[73] Assignee: Ricoh Company, Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/799,297

[22] Filed: Feb. 13, 1997

[30] Foreign Application Priority Data

Feb. 17, 1996 [JP] Japan ..................... 8-053949

[51] Int. Cl.[7] .................................. G01R 31/02
[52] U.S. Cl. ........................... 324/754; 324/765
[58] Field of Search ................... 324/754, 765, 324/755; 414/222, 287, 331, 737

[56] References Cited

U.S. PATENT DOCUMENTS

| | | | |
|---|---|---|---|
| 4,778,326 | 10/1988 | Althouse et al. | 414/800 |
| 4,869,636 | 9/1989 | Reid et al. | 414/331 |
| 5,027,063 | 6/1991 | Letourneau | 324/754 |
| 5,227,717 | 7/1993 | Tsurishima et al. | 324/754 |
| 5,575,610 | 11/1996 | Soyama | 414/750 |
| 5,596,282 | 1/1997 | Giddings et al. | 324/754 |

FOREIGN PATENT DOCUMENTS

1272127  10/1989  Japan .

*Primary Examiner*—Josie Ballato
*Assistant Examiner*—Russell M. Kobert
*Attorney, Agent, or Firm*—Cooper & Dunham LLP

[57] ABSTRACT

A semiconductor test system comprises a tray including a plurality of pockets for accommodating a plurality of semiconductor component parts, a sucking mechanism for sucking the semiconductor component parts to firmly maintain the semiconductor component parts in the tray and a mechanism for moving the tray of semiconductor component parts relative to the sucking mechanism.

4 Claims, 11 Drawing Sheets

**FIG. 13
Prior Art**

SEMICONDUCTOR COMPONENT TEST APPARATUS INCLUDING SUCKING MECHANISM MAINTAINING COMPONENTS IN TRAY DURING TESTING

BACKGROUND OF THE INVENTION

1. Field of the Invention

The present invention relates to a test apparatus for testing semiconductor component parts carried in a tray.

2. Description of the Related Art

Semiconductor component parts are typically accommodated in a tray after fabrication thereof. Before the component parts are mounted in a device, they are subjected to visual inspection to determine if protruding connecting electrodes (bumps or leads) formed on each of the semiconductor component parts are properly positioned. In addition, the component parts are subjected to electrical testing during which probe needles are brought into contact with the electrodes or bumps of each semiconductor component part and electrical testing is performed. Semiconductor component parts which fail to satisfy specific requirements of the visual inspection or electrical testing are rejected, and the passing parts are supplied to a mounting manipulator for actual mounting in the device.

Figure 9:
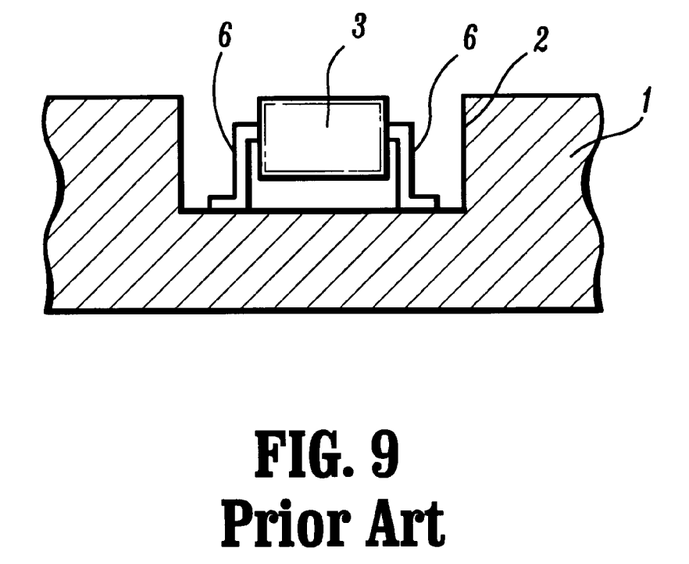
FIGS. 9–13 show a semiconductor part being subjected to testing in a conventional manner.
Figure 10:
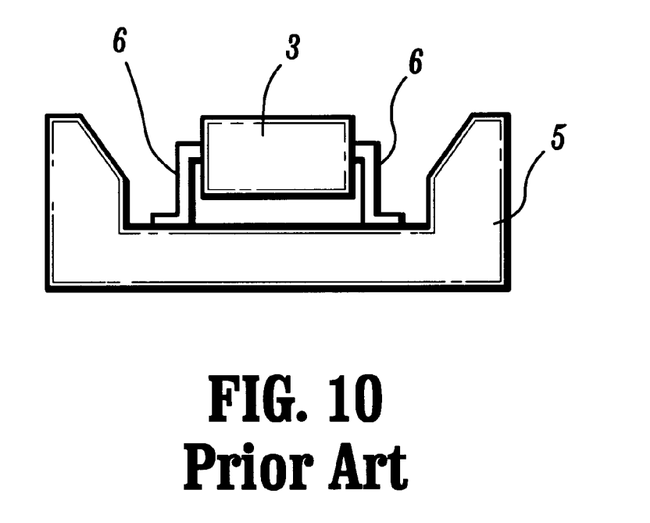

Typically, the visual inspection and the electrical testing are performed in a sequence such as that shown in FIGS. 9 to 13. As shown in FIG. 9, a plurality of semiconductor component parts 3 are accommodated in pockets 2 defined in tray 1. Semiconductor component parts 3 are successively picked up by a movable handler (not shown) one by one and placed on a regulating member 5 as shown in FIG. 10.

Regulating member 5 defines the permissible configurational requirements of component parts 3, such as a profile of each semiconductor component part and the positions where leads 6 are fitted. Each semiconductor component part 3 must satisfy these configurational requirements prior to mounting onto the device. If the semiconductor component part 3 fails to fit completely into the regulating member 5, the semiconductor component part 3 is deemed to fail to satisfy the permissible configurational requirements and is therefore removed from the production line.

Figure 11:
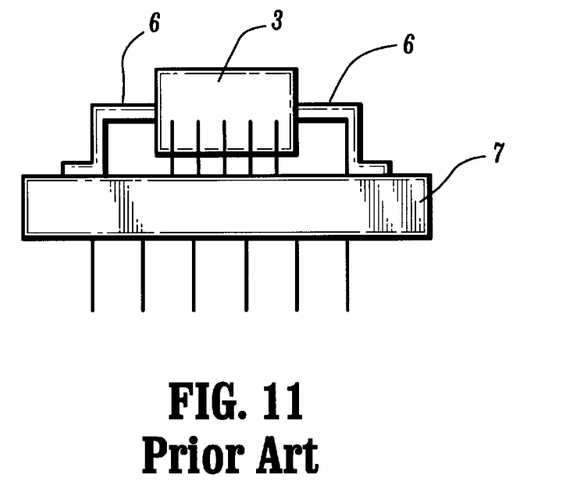
Figure 12:
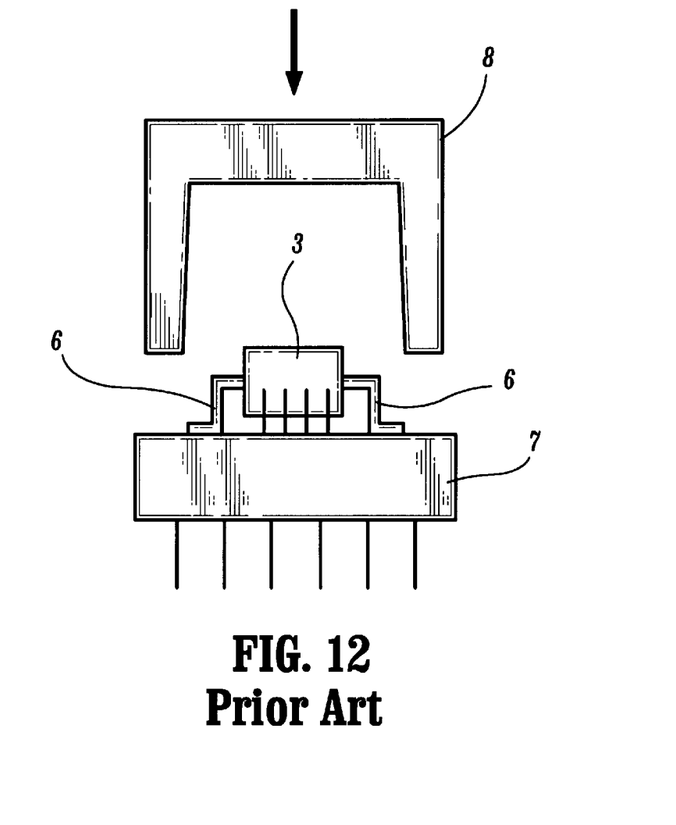
Figure 13:
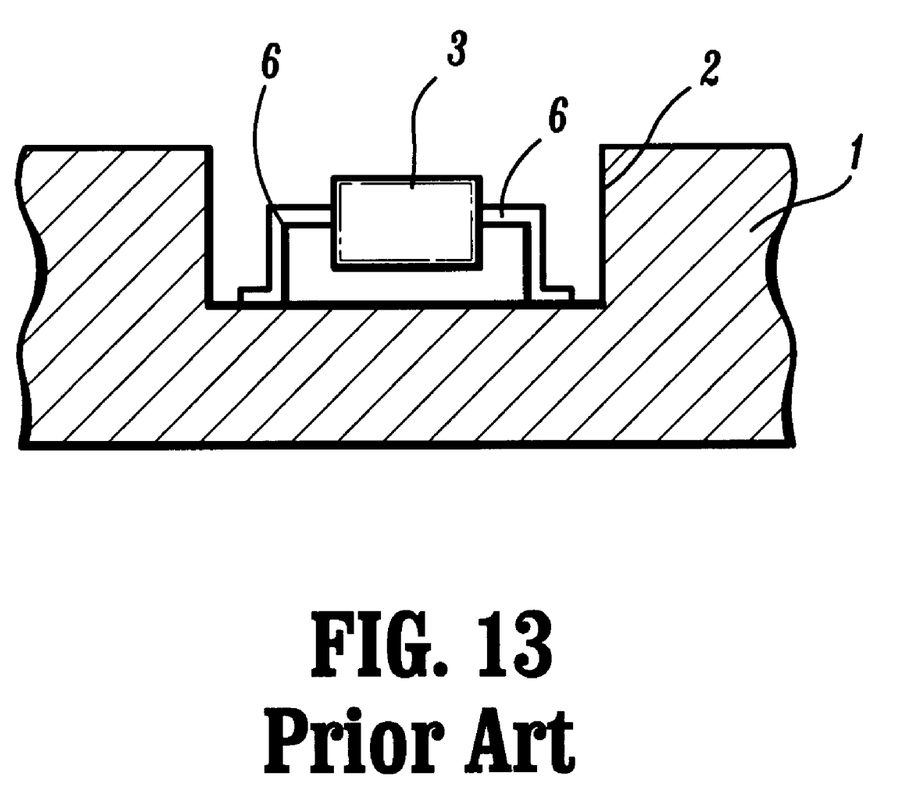

The semiconductor component parts which have been deemed to satisfy the permissible configurational requirements as a result of them having been successfully fitted into regulating member 5 are then electrically tested. That is, the passing parts are successively picked up by the movable handler and mounted on an IC socket 7 as shown in FIG. 11. After mounting on the IC socket 7 a test probe 8 is brought into contact with a bonding pad of the semiconductor component part 3 on the IC socket 7 as shown in FIG. 12, and electrical testing is performed on the semiconductor component part 3. If the semiconductor component part 3 fails to satisfy prescribed test conditions, the semiconductor component part 3 is removed from the production line. Only the semiconductor component parts 3 having satisfied the prescribed test conditions are successively returned to the initial pockets 2 in the tray 1, as shown in FIG. 13.

In this way, all of the semiconductor component parts 3 accommodated within the respective pockets 2 in tray 1 are subjected to visual examination and electrical testing. Only the semiconductor components parts 3 which have passed both of these tests are returned to the tray and are then supplied to the mounting manipulator for actual mounting thereof in the device.

In carrying out the visual inspection and electrical testing discussed above, the semiconductor component parts 3 are required to be transported one by one by the movable handler to the visual examination station and then to the electrical testing station. Accordingly, it takes a relatively long time to complete the visual inspection and the electrical testing subsequent to start thereof, posing a problem in that testing cannot be carried out efficiently.

Japanese Laid-open Patent Application No. 1-272127 discloses a loop transport system for a robot handler. A tray having a plurality of pockets defined therein for accommodating respective semiconductor component parts is rotated. The pockets are arranged to represent a generally loop-like shape thereby reducing the length of time required to transport the semiconductor components parts. According to this loop transport system, the semiconductor component parts are successively pushed out from a tube onto a bench in preparation for examination. The parts are successively transported from the bench to the pockets in the tray. The tray is then rotated and visual inspection is performed on the semiconductor component parts which are then moved to a test electrode.

The length of time required to transport the semiconductor component parts can be reduced with this system. However, often during transport, which is performed by mechanical arm, some of the semiconductor component parts may be transported to the pockets in the tray and displaced in position or orientation to such an extent that examination by a test electrode can no longer be performed accurately. Also, during transportation, some of the semiconductor component parts may be dropped, so that the visual inspection and testing cannot be performed at all.

SUMMARY OF THE INVENTION

According to an embodiment of the present invention, a semiconductor test system includes a tray including a plurality of pockets for accommodating a plurality of semiconductor component parts, a sucking mechanism for sucking the semiconductor component parts to firmly maintain the semiconductor component parts in the tray during testing and a mechanism for moving the tray of semiconductor component parts relative to the sucking mechanism. The system can further include a visual inspection device including an image processor for performing a visual inspection of the semiconductor component parts and/or test probes for performing electrical tests on the semiconductor component parts.

According to another embodiment, a semiconductor test apparatus includes a suction member for providing a suction force to a first side of a semiconductor component part provided in a tray so as to firmly maintain the semiconductor component part in the tray during testing. A visual inspection device performs a visual inspection on the semiconductor component part while the semiconductor component part is being firmly maintained in the tray by the suction member. An electrical test device performs electrical tests on the semiconductor component part while the semiconductor component part is being firmly maintained in the tray by the suction member. The suction member includes a suction pad that contacts the first side of the semiconductor component part and a positioning stopper that supports the suction pad and positions the tray relative to the suction pad.

A method is also disclosed for testing semiconductor component parts and includes steps of moving a tray of semiconductor component parts to a first position, providing suction to firmly maintain the semiconductor component parts in the tray and performing at least one test on the semiconductor component parts while the parts are being firmly maintained in the tray.

BRIEF DESCRIPTION OF THE DRAWINGS

Novel features believed characteristic of the invention are set forth in the appended claims. The invention itself, however, as well as other features and advantages thereof, may best be understood by reference to the following detailed description of illustrative embodiments, when read in conjunction with the accompanying drawings, in which:

DETAILED DESCRIPTION OF THE PREFERRED EMBODIMENTS

Figure 3A:
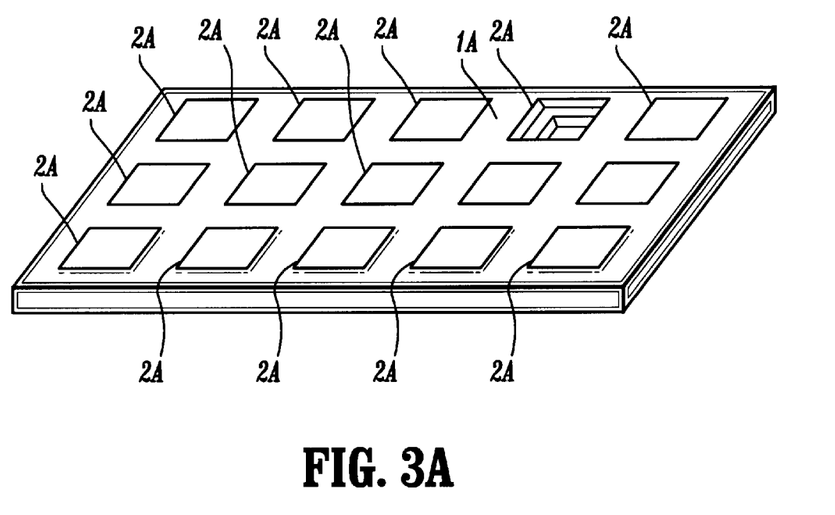
FIG. 3A is a perspective view of a tray according to an embodiment of the present invention.
Figure 3B:
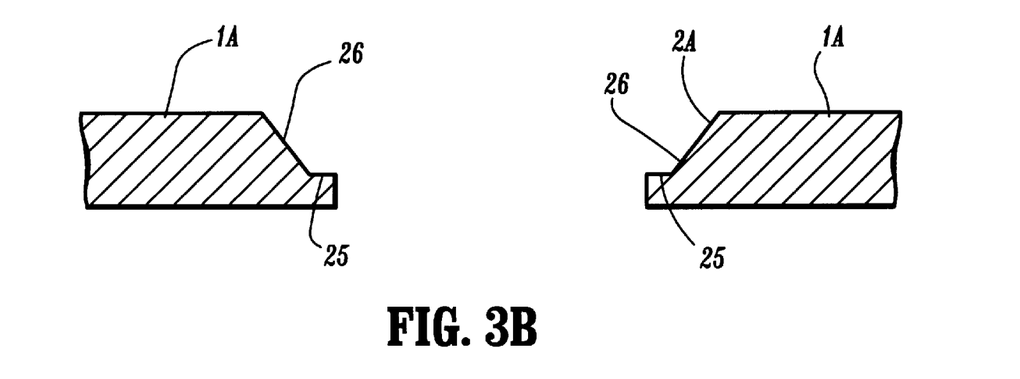
FIG. 3B is a close-up partial cross sectional view of the tray depicted in FIG. 3A.
Figure 4A:
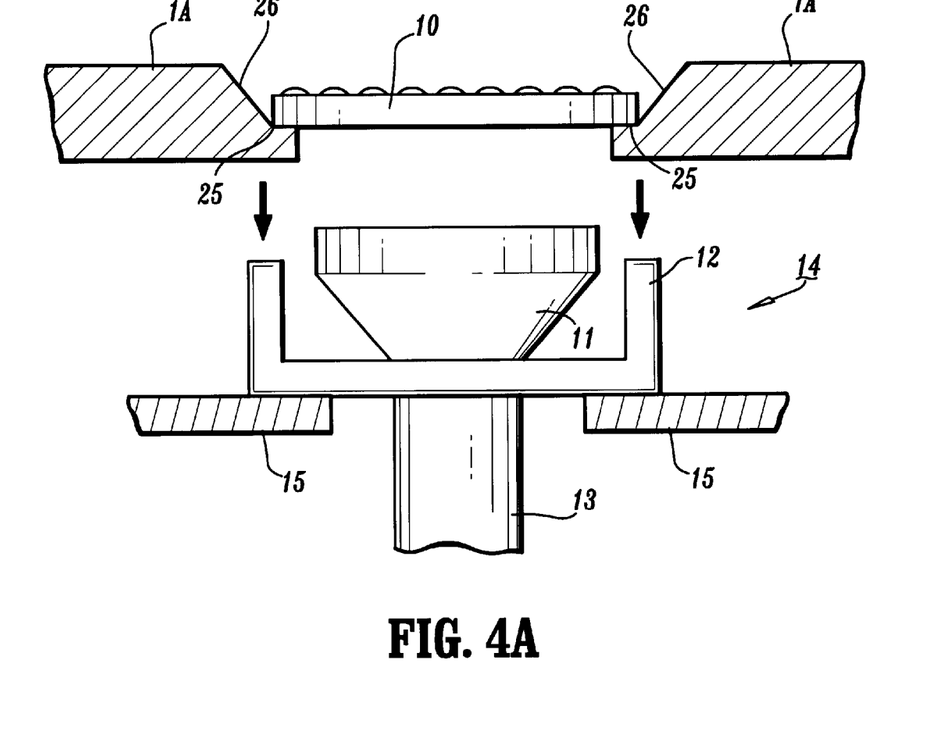
FIGS. 4A and 4B are sectional views of the tray being placed on the test bed according to an embodiment of the present invention.

An embodiment of the present invention will now be described by reference to the figures, in which FIGS. 3A and 3B depict a tray according to an embodiment of the present invention. As shown in FIG. 3A, tray 1A is in the shape of a parallelepiped tube. Tray 1A is formed with three rows of pockets 2A, each row including five pockets. That is, tray 1A includes a total of 15 pockets 2A. Of course, the number of rows and pockets is not limited to that shown. Each pocket 2A extends completely through tray 1A, from an upper surface to a lower surface. As shown in FIG. 3B, a lower portion of each pocket 2A has a ring-shaped flat face 25 defined at a lower peripheral edge. Each pocket 2A is an opening having a rectangular sectional shape having upwardly sloped sides 26. Pockets 2A are dimensioned so that the semiconductor component parts 10 to be tested rest in the pocket 2A on ring-shaped flat face 25, as shown in FIG. 4A.

Tray 1A is designed so that, with a semiconductor component part 10 disposed in each of the corresponding pockets 2A, the tray can be transported to one or more predetermined test stations so that the parts may undergo visual inspection and/or electrical testing while remaining in the tray.

Figure 5A:
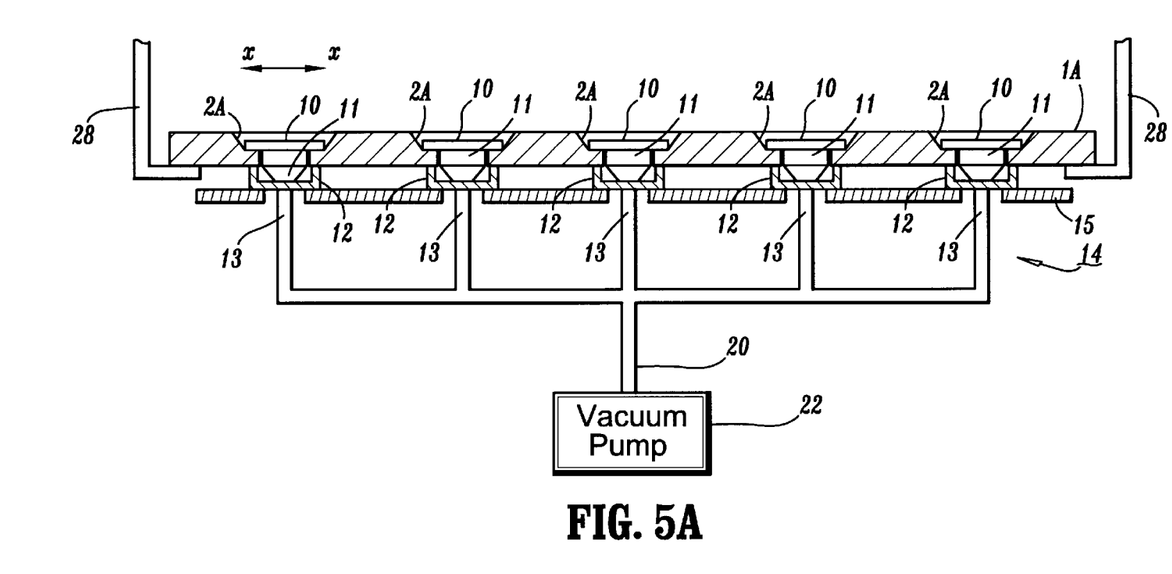
FIG. 5A is a cross-sectional view of a test bed taken along lines 5A—5A in FIG. 5B, showing the test bed including the suction arrangement according to an embodiment of the present invention.
Figure 5B:
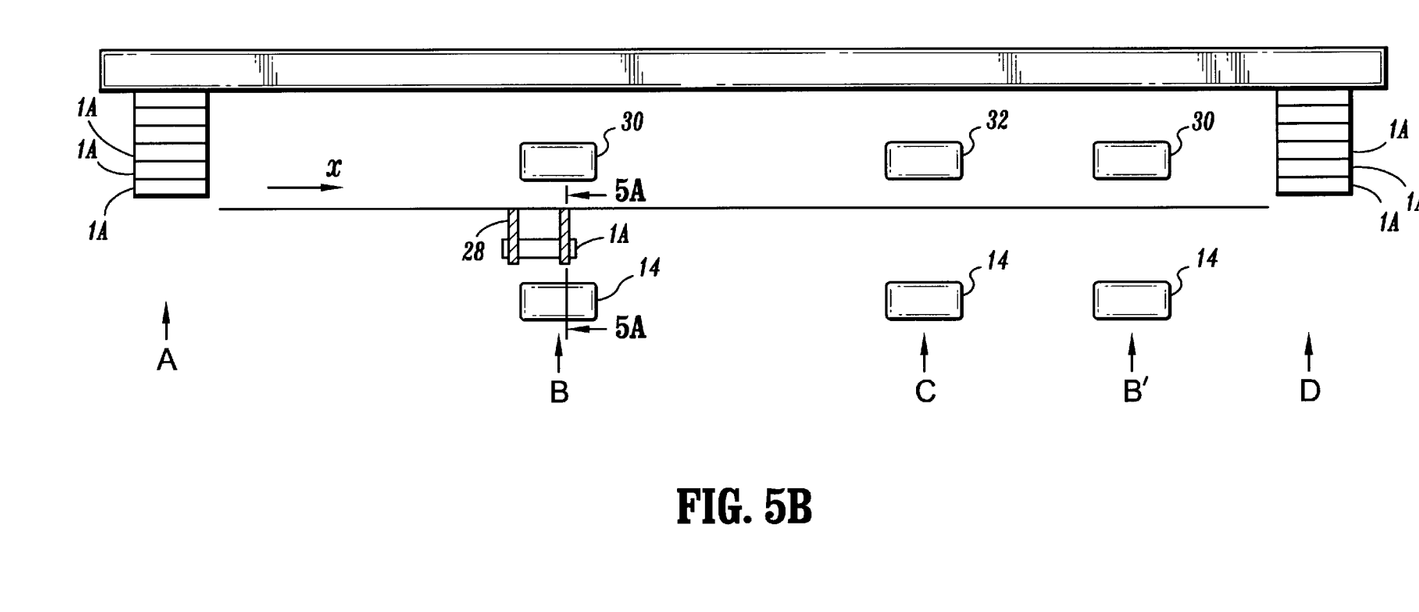
FIGS. 5B–5D are diagrams showing test systems according to embodiments of the present invention.

As depicted in FIG. 5B, a test system according to an embodiment of the present invention includes at position A, a plurality of stacked trays 1A containing semiconductor component parts which are to be tested. A moving mechanism 28 moves trays 1A to the various test stations. Moving mechanism 28 is capable of moving a tray 1A from the stack of trays (position A) and transporting it in the direction indicated by arrow X to each test station (positions B, C and B') and then, after testing is completed, stacking the tray with the other tested trays of parts (position D). (Various types of suitable moving mechanisms are well known in the art and will not be described in detail.)

Figure 2A:
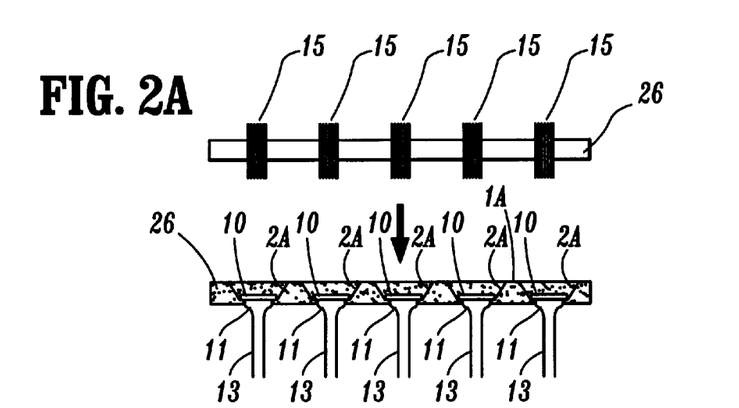
FIG. 2A is a diagram showing a set of test probes according to an embodiment of the present invention.
Figure 2B:
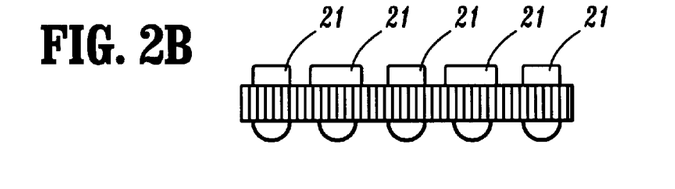
FIG. 2B is a diagram showing a set of CCD cameras according to an embodiment of the present invention.
Figure 7:
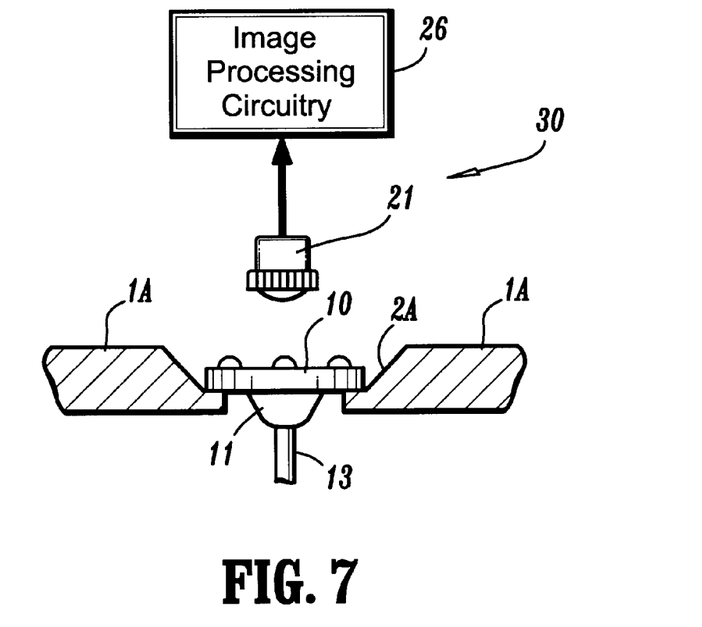
FIG. 7 is a diagram showing a semiconductor part being subjected to visual inspection according to an embodiment of the present invention.

The first and third test stations (positions B and B') are visual inspection stations and include a visual inspection device 30 for visually inspecting each semiconductor component part accommodated in tray 1A. Accordingly, the semiconductor component parts can be subjected to visual inspection prior to electrical testing and after electrical testing prior to stacking with the other tested trays of parts. An example of a visual inspection device 30 is shown in FIG. 7 and consists of CCD camera 21 and image processing circuitry 26. Such CCD cameras and image processing circuitry are well known in the art and will therefore not be described in detail. CCD camera 21 is mounted on a moving mechanism (not shown) and can be selectively moved to sequentially visually inspect each component part 10 in tray 1A. In the alternative, a plurality of CCD cameras 21 can be provided as shown in FIG. 2B, so that more than one of the component parts 10 in tray 1A can be simultaneously visually inspected. The test stations also include a test bed 14 such as that depicted in FIG. 5A, for example, for simultaneously firmly holding some or all of the component parts in place in tray 1A during testing.

Figure 6:
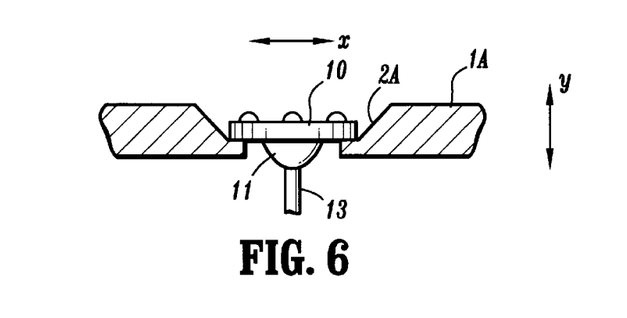
FIG. 6 is diagram showing the directions in which the tray can be transported according to an embodiment of the present invention.

Moving mechanism 28 carries tray 1A to test bed 14. (As depicted in FIG. 5A, moving mechanism 28 moves tray 1A in a direction perpendicular to the plane of the sheet of paper. As shown in FIG. 6, tray 1A can also be moved by moving mechanism 28 in the X-axis direction and the Y-axis direction.)

Figure 4B:
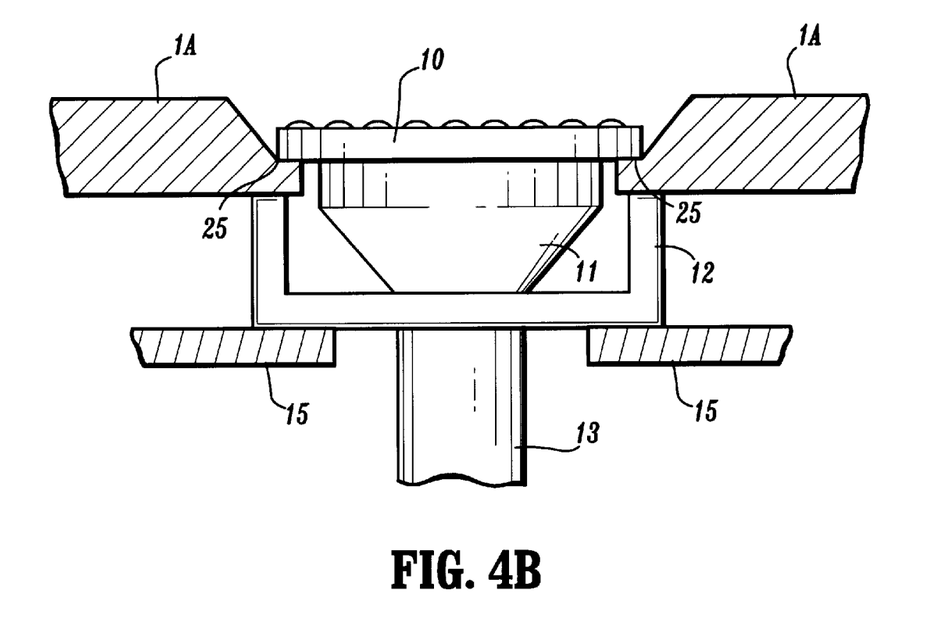

As shown in FIG. 5A, test bed 14 includes five sets of suction devices, each positioned to be directly below a corresponding pocket 2A in tray 1A when the tray is positioned at a test station. As shown in more detail in FIGS. 4A and 4B, each suction device in test bed 14 includes a suction pad 11, and a positioning stopper 12. Positioning stoppers 12 are supported by platform 15. Tray 1A, having semiconductor component parts 10 provided therein, is brought into position and placed on test bed 14, so that positioning stoppers 12 support tray 1A, and suction pads 11 contact the underside of component parts 10. Each suction pad 11 is integrally formed with an air hose 13 and each suction pad 11 is secured to positioning stopper 12. Each air hose 13 is connected with a suction tube 20 (FIG. 5A). Suction tube 20 communicates with a vacuum pump or a vacuum ejector 22 which converts pressurized air into a vacuum. Positioning stoppers 12 contact the lower plate surface of tray 1A so that the respective suction pads 11 are positioned in an optimum position relative to the associated pocket 2A. According to this embodiment of the present invention, five suction pads 11 are provided so that a row of component parts can be simultaneously firmly held in place in tray 1A during testing. Of course, more or less suction pads can be provided as desired.

When the vacuum pump or the vacuum ejector 22 is activated, it converts pressurized air into a vacuum and the suction tube 20, the air hoses 13 and the suction pads 11 are evacuated. This allows the respective semiconductor component parts 10 to be pulled gently but firmly against suction pads 11. Accordingly, parts 10 are snugly seated on the associated ring-shaped flat faces 25, thereby permitting the semiconductor component parts 10 to be stably retained in tray 1A during testing.

As noted above, CCD camera 21 can be moved into position over each component part 10 being retained in tray 1A for performing visual inspection including verification of the respective positions of the electrodes or bonding pad bumps, using image processing circuitry 26. For example, CCD camera 21 can be moved in the directions indicated by arrows X in FIG. 5A and can be moved back and forth in a direction normal to the plane of the paper as shown in FIG. 5A. In the alternative, as shown in FIG. 2B, an array of 5 CCD 21 cameras can be arranged in a row in order to simultaneously test all five parts currently being retained in tray 1A. Each row of parts can then be simultaneously sequentially tested.

Figure 1:
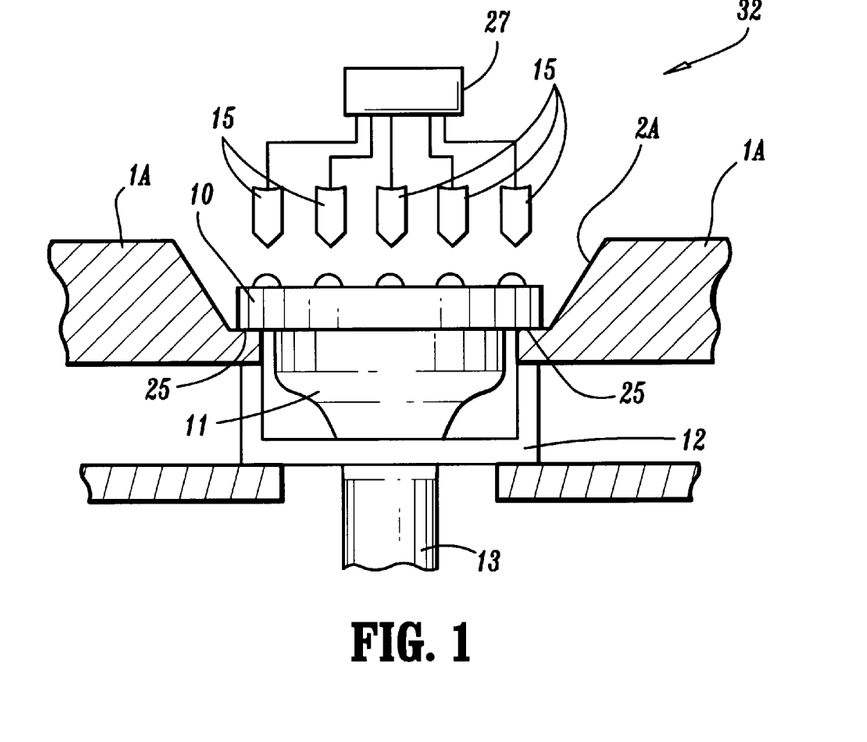
FIG. 1 is a diagram showing a portion of a tray holding a semiconductor part and a test bed setup according to an embodiment of the present invention.
Figure 8:
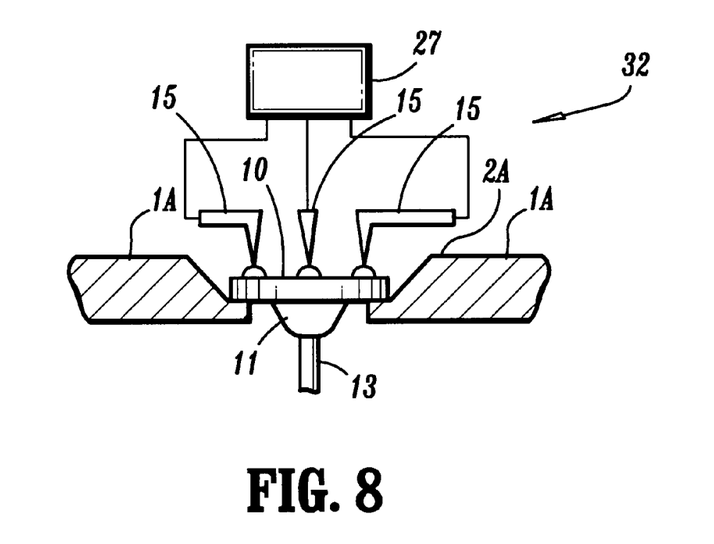
FIG. 8 is a diagram showing a semiconductor part being subjected to electrical testing according to an embodiment of the present invention.

The second test station (position C) includes an electrical test device 32 that electronically tests the semiconductor component parts retained in tray 1A which have passed the visual inspection performed at the first station (position B). As shown in FIGS. 1 and 8, the electrical test device 32 includes a plurality of probe needles 15 and testing circuitry 27. Electrical testing is performed on each semiconductor component part 10 by bringing probe needles 15 into contact with the corresponding bonding pads 10 on each of the semiconductor component parts 10 provided in tray 1A. According to an embodiment of the present invention as shown in FIG. 2A, five sets of probes are provided. The probes are arranged so that each set of probe needles 15 are aligned with the bonding pads of a semiconductor component part 10 being retained by test bed 14 in a respective pocket 2A in tray 1A. Of course, one set of probe needles 15 can be mounted on a movable member so that each part in the row can be tested in turn. In the alternative, fifteen sets of probe needles can be provided, each set aligned with a corresponding pocket 2A of tray 1A. Preferably, in this case, a corresponding number of suction pads 11 are provided to hold each of the component parts firmly in place during testing.

The operation of an embodiment of the present invention will now be described.

Semiconductor component parts 10 are placed in the associated pockets 2A in tray 1A so that each is seated on a ring-shaped flat face 25 (FIG. 4A). The trays of component parts to be tested are stacked at position A (FIG. 5B). A Tray 1A is removed from the stack by moving mechanism 28 and brought to position B so that suction pads 11 are lined up with the respective pockets 2A in the first row of pockets in tray 1A. Tray 1A is then lowered so that it rests on and is positioned by positioning stoppers 12.

Vacuum pump 22 is activated to evacuate suction tube 20, air hoses 13 and suction pads 11 so that semiconductor component parts 10 are sucked by suction pads 11 and pulled firmly onto the associated ring-shaped flat faces 25. Semiconductor component parts 10 are thus stably retained in tray 1A.

CCD camera 21 is then moved into position above one of the component parts 10 being retained in tray 1A. (Of course, in the alternative, a moving mechanism can be provided to move test bed 14 and tray 1A to a predetermined position aligned with CCD camera 21.) The visual inspection, including verification of the respective positions of the bumps or leads, can then be carried out by the CCD camera 21 and image processing circuitry 26. Visual inspection is performed one at a time on the semiconductor component parts 10 until all of the parts in tray 1A have been inspected. (As noted above, if plural CCD cameras 21 are provided, a plurality of parts can be simultaneously inspected.)

After a row of parts have been tested, vacuum pump 22 is deactivated and tray 1A is moved so that the second row of parts 10 is positioned above suction pads 11. Vacuum pump 22 is then activated so that this row of component parts 10 are tightly sucked onto ring-shaped flat faces 25. These parts are then subjected to visual inspection. This is repeated for each row of component parts in tray 1A.

The semiconductor component parts 10 which fail the visual inspection are deemed to have failed to satisfy the configurational requirements and are labeled with a marking to indicate a faulty part. (This could be in the form of a physical marking or by electronically keeping track of which device has failed inspection.) Faulty parts are not subjected to subsequent electrical testing. The semiconductor component parts 10 which have been deemed an acceptable product during visual examination are then subjected to electrical testing.

Tray 1A is moved by moving mechanism 28 to position C into alignment with electrical test device 32. Tray 1A is spaced a predetermined distance from, probe needles 15, as shown in FIGS. 1 and 2. In the alternative, probe needles 15 can be moved into position relative to tray 1A.) Probe needles 15 are then brought into contact with the bonding pads of the semiconductor component parts 10 and electrical testing is performed on semiconductor component parts 10.

In this way, electrical testing can be performed on each semiconductor component part 10 which has been deemed an acceptable product during visual inspection. The semiconductor component parts 10 which have been deemed to exhibit faulty electrical characteristics during electrical testing are labeled to indicate a faulty product.

Tray 1A is then moved by moving mechanism 28 to position B' so that a final visual inspection can be performed on the semiconductor component parts 10.

The semiconductor component parts 10 which have been labeled faulty products during either or both of the visual inspections or the electrical testing can then be removed from tray 1A by a handling mechanism (not shown) or by an operator of the system. Accordingly, only the semiconductor component parts 10 which have been deemed acceptable as a result of both the visual inspections and the electrical testing remain in tray 1A, which is then stacked at position D. The trays of passing parts are then supplied to an assembly robot for actual mounting of the parts in a device.

Figure 5C:
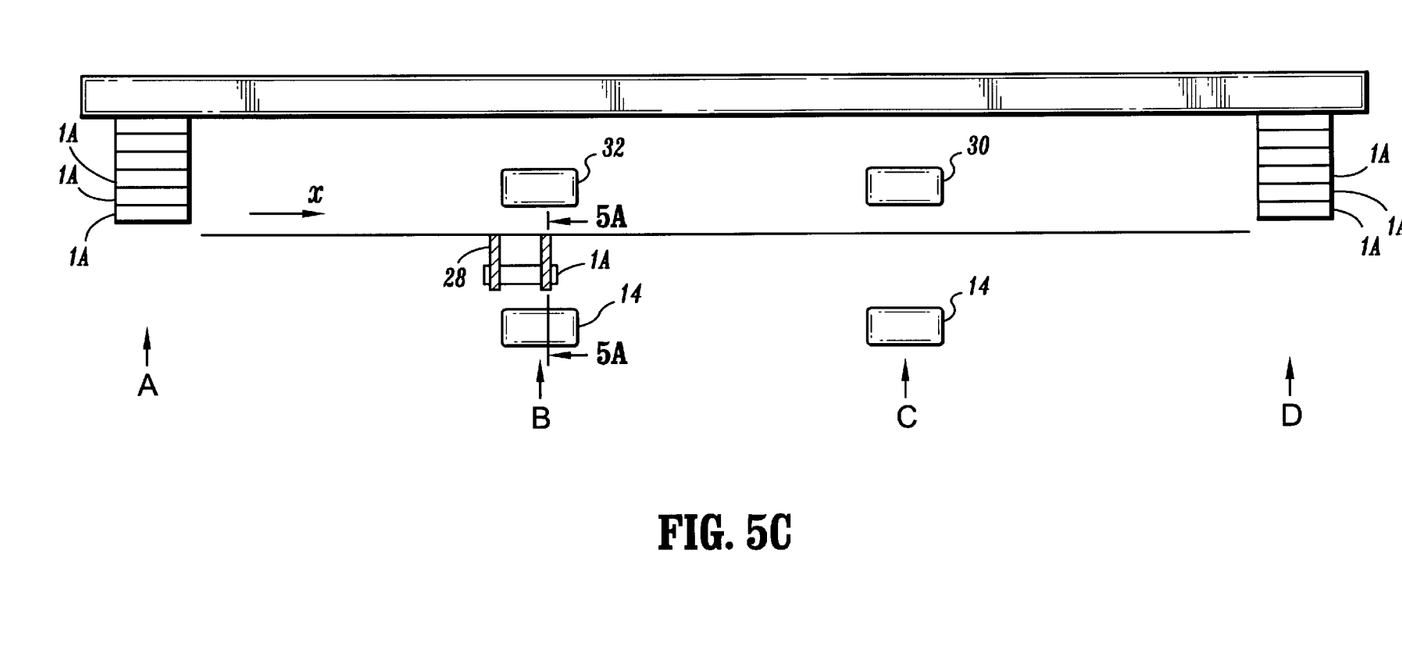

According to another embodiment of the present invention as depicted in FIG. 5C, electrical testing is first performed in a manner similar to that described above, at position B. After electrical testing, visual inspection is then performed at position C. The failing devices are marked and/or removed and the tray is stacked at position D.

Figure 5D:
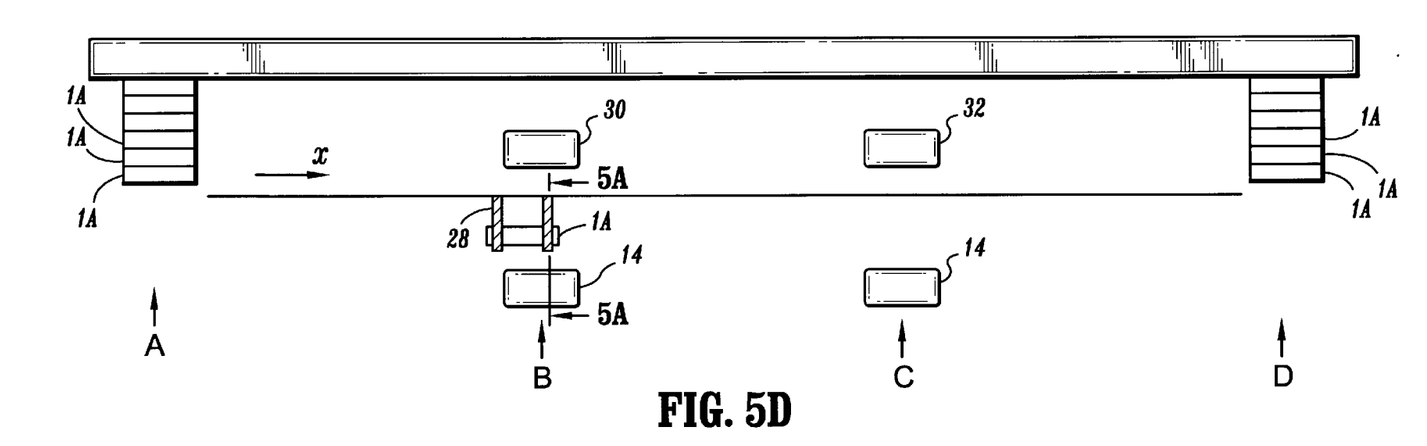

According to still another embodiment of the present invention as depicted in FIG. 5D, a second visual inspection station is not provided. Accordingly, the semiconductor parts are visually inspected at position B and then electrically tested at position C. The tray of component parts can then be stacked at position D. In the alternative, after electrical testing at position C, the tray can be returned to position B for a final visual inspection prior to stacking at position D.

Figure 5E:
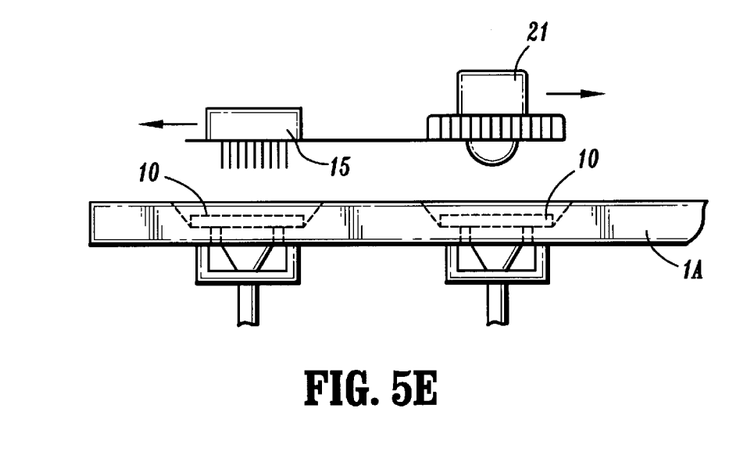
FIG. 5E is a diagram showing a CCD camera and test probe arrangement according to an embodiment of the present invention.

According to another embodiment of the present invention as depicted in FIG. 5E, a single test station can be provided with a CCD camera 21 and one set of test probes 15 arranged so that immediately after a visual inspection is performed by CCD camera 21 on a component part 10, test probes 15 can be moved into position to electrically test that component part. At the same time, CCD camera 21 can be visually inspecting the next component part. Of course, if a component part fails the visual inspection, it does not need to be subjected to electrical testing. This can be repeated until each component part has been tested.

According to still another embodiment of the present invention, a number of suction pads 11 corresponding to the number of pockets 2A in each tray can be provided. In this case, the test bed 14 can include a moving mechanism (not shown) or can be associated with and moved by moving mechanism 28 so that each component part 10 can be firmly maintained in tray 1A during transport as well as during testing.

Because of the foregoing, there is no possibility of the semiconductor component parts 10 in tray 1A being displaced by vibrations during transport thereof. For example, this would prevent component parts 10 from bouncing out of the associated pockets 2A and/or being displaced in position due to vibrations during transport. Accordingly, the semiconductor component parts 10 in tray 1A can be transported to the predetermined test positions while being maintained in a predetermined position and both the visual examination and the electrical testing can be performed quickly and accurately on the semiconductor component parts 10.

While for purposes of illustration and explanation, several forms of this invention have been disclosed, other forms thereof may become apparent to those skilled in the art upon reference to this disclosure and, therefore, this invention is to be limited only by the scope of the appended claims.

What is claimed is:

1. A semiconductor test system comprising:

a tray including a plurality of pockets for accommodating a plurality of semiconductor component parts during transportation between test stations and during testing;

at least one test station for performing at least one test on the semiconductor component parts accommodated in the tray;

a sucking mechanism for sucking the semiconductor component parts to firmly maintain the semiconductor component parts in the tray during testing at the at least one test station; and a mechanism for moving the tray of semiconductor component parts relative to the sucking mechanism.

2. A semiconductor test system as recited in claim 1, further comprising a visual inspection device for performing image processing including performing a visual inspection of the semiconductor component parts.

3. A semiconductor test system as recited in claim 2, further comprising test probes for performing electrical tests on the semiconductor component parts.

4. A semiconductor test system as recited in claim 1, further comprising test probes for performing electrical tests on the semiconductor component parts.

* * * * *